(12) United States Patent
Zhou (10) Patent No.: US 10,734,988 B2
(45) Date of Patent: Aug. 4, 2020

(54) METHODS AND APPARATUS TO GENERATE A CIRCUIT PROTECTION VOLTAGE

(71) Applicant: Hewlett Packard Enterprise Development LP, Houston, TX (US)

(72) Inventor: Dacheng Zhou, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 217 days.

(21) Appl. No.: 15/853,215

(22) Filed: Dec. 22, 2017

(65) Prior Publication Data

US 2019/0199339 A1    Jun. 27, 2019

(51) Int. Cl.

| | | |
|---|---|---|
| *H03K 17/00* | (2006.01) | |
| *H03K 17/08* | (2006.01) | |
| *G06F 1/3296* | (2019.01) | |
| *G06F 1/3287* | (2019.01) | |
| *G06F 1/3206* | (2019.01) | |
| *H03K 17/042* | (2006.01) | |

(Continued)

(52) U.S. Cl.
CPC ........... *H03K 17/08* (2013.01); *G06F 1/3206* (2013.01); *G06F 1/3287* (2013.01); *G06F 1/3296* (2013.01); *H03K 17/002* (2013.01); *H03K 17/005* (2013.01); *H03K 17/042* (2013.01); *H03K 17/51* (2013.01); *H03K 17/56* (2013.01)

(58) Field of Classification Search
CPC ...... H02J 9/00; H02J 9/04; H02J 9/06; H03K 17/002; H03K 17/005; H03K 17/042; H03K 17/51; H03K 17/56
USPC .............................................. 307/64, 43–45
See application file for complete search history.

(56) References Cited

U.S. PATENT DOCUMENTS

| | | |
|---|---|---|
| 5,952,866 A | 9/1999 | Kothandaraman et al. |
| 6,014,039 A | 1/2000 | Kothandaraman et al. |

(Continued)

FOREIGN PATENT DOCUMENTS

| | | |
|---|---|---|
| GB | 2201058 | 8/1988 |
| WO | 2009/023021 A1 | 2/2009 |

OTHER PUBLICATIONS

International Search Report and Written Opinion received for PCT Application No. PCT/US2018/067308, dated Apr. 9, 2019, 11 pages.

(Continued)

*Primary Examiner* — Adi Amrany
(74) *Attorney, Agent, or Firm* — Park, Vaughan, Fleming & Dowler LLP (57) ABSTRACT

Apparatus, methods and systems to produce a protection voltage are disclosed. The apparatus includes circuitry to deliver a first supply voltage to a plurality of circuits, where the first supply voltage has a first magnitude, circuitry to deliver a second supply voltage to a part of the plurality of circuits, where the second supply voltage has a second magnitude, and circuitry to deliver a protection voltage to the part of the plurality of circuits when the second supply voltage is LOW and the first supply voltage is HIGH. The protection voltage has a magnitude that is a fraction of the magnitude of the first supply voltage. The apparatus includes circuitry that causes the delivery of the second supply voltage to the part of the plurality of circuits when the second supply voltage is turned HIGH subsequent to the second supply voltage being LOW when the first supply voltage is HIGH.

20 Claims, 7 Drawing Sheets

(51) Int. Cl.
   *H03K 17/51*   (2006.01)
   *H03K 17/56*   (2006.01)

(56) References Cited

U.S. PATENT DOCUMENTS

| | | | | |
|---|---|---|---|---|
| 6,130,556 | A | 10/2000 | Schmitt et al. | |
| 6,253,330 | B1* | 6/2001 | Denkin | H02J 1/108 307/52 |
| 7,205,681 | B2* | 4/2007 | Nguyen | H02J 1/10 307/18 |
| 7,671,489 | B1* | 3/2010 | Uy | H02J 9/061 307/130 |
| 8,546,977 | B2* | 10/2013 | Togare | H02J 1/102 307/112 |
| 9,620,185 | B1* | 4/2017 | Jeong | G11C 5/14 |
| 9,679,887 | B1 | 6/2017 | Huang | |
| 2008/0164759 | A1* | 7/2008 | Sharma | H02J 1/10 307/52 |
| 2009/0059628 | A1* | 3/2009 | Kim | G05F 1/467 363/40 |
| 2009/0180231 | A1 | 7/2009 | Tanaka | |
| 2010/0013313 | A1* | 1/2010 | Groff | H02J 9/061 307/66 |
| 2013/0278296 | A1 | 10/2013 | Amirkhany et al. | |
| 2013/0301374 | A1* | 11/2013 | Liao | G11C 8/08 365/230.06 |
| 2014/0071720 | A1* | 3/2014 | Ouyang | H02H 7/1213 363/50 |
| 2016/0098050 | A1* | 4/2016 | Enjalbert | G05F 1/56 323/280 |
| 2016/0359315 | A1 | 12/2016 | Khasnis et al. | |
| 2018/0062509 | A1* | 3/2018 | Duong | H02M 1/08 |
| 2018/0348836 | A1* | 12/2018 | Huang | G06F 1/30 |

OTHER PUBLICATIONS

Linear Technology, "Surge Stopper, Overvoltage & Overcurrent Protection", published on Sep. 30, 2015, accessed on Sep. 8, 2017, [http://www.linear.com/products/Surge_Stopper,_Overvoltage_*_Overcurrent_Protection], 3 pages.

* cited by examiner

Figure 1A:
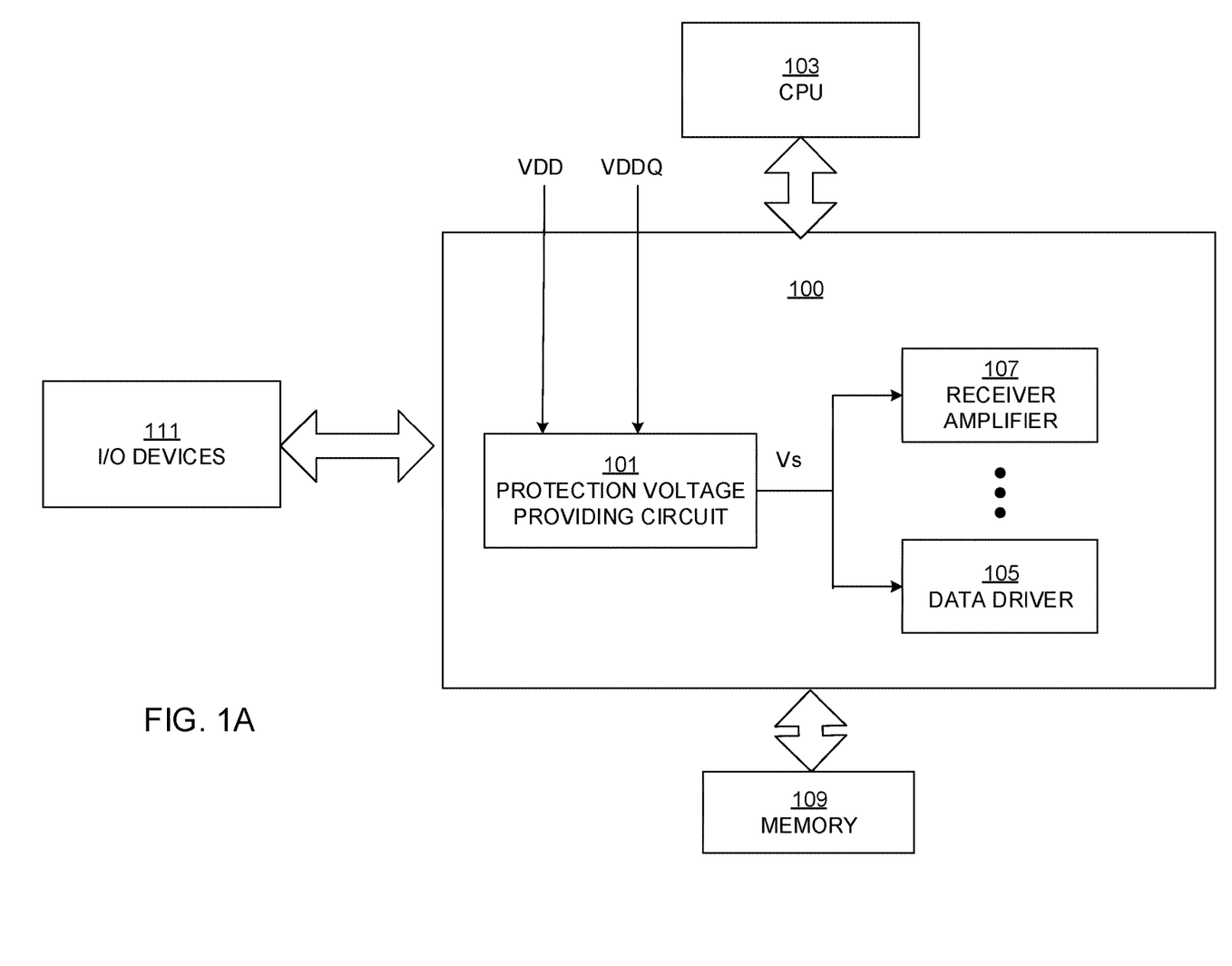
FIG. 1A is a schematic illustration of an example operating environment of a protection voltage providing circuit.

FIG. 6 ion voltage providing circuit. FIG. 1A shows input/output (I/O) circuit 100, protection voltage providing circuit 101, CPU 103, data driver 105, receiver amplifier 107, memory 109, and I/O devices 111.

METHODS AND APPARATUS TO GENERATE A CIRCUIT PROTECTION VOLTAGE

FIELD OF THE DISCLOSURE

This disclosure relates generally to circuit protection, and, more particularly, to generating circuit protection voltages.

BACKGROUND

An input/output (I/O) interface is a system that enables the transfer of information between internal storage and external I/O devices. In particular, the I/O interface acts as an interface between the central processing unit (CPU) and memory and to one or more peripherals. In many high-speed I/O circuit designs, several different power supply voltages may be used in order to meet a particular I/O specification. For example, some conventional designs use supply VDDQ ranging from 1.2 volts (v) to 1.5v and core logic positive supply (VDD) ranging from 0.8v to 0.9v. Designing I/O circuits that use different supply voltages can present challenges. Such designs can include the use of both high-voltage transistors and low-voltage transistors.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

In many high-speed input/output (I/O) interface systems different power supply voltages are used to meet I/O specification. For example, DDRX IP designs use an I/O supply VDDQ that ranges from 1.2v to 1.5v and a core logic supply VDD 201 that ranges from 0.8v to 0.9v. In order to tolerate 1.5v I/O supplies and input signal levels, high-voltage I/O field-effect transistors (FETS) are commonly used in I/O circuit design. For 16 nanometer (nm) designs, PMOS or NMOS 1.5v tolerant I/O transistors with channel lengths of 86 nm and with threshold voltages (Vth) that are greater than 0.45v are used. Because such high-voltage transistors are designed to operate at 1.5v, with a double data rate 4 (DDR4) 1.14v power supply, the high-voltage transistors are extremely slow and may not be suitable for 3.2 gigabits per second (Gbps) DDR4 high-speed operation. To meet 3.2 Gbps DDR4 high speed specifications, high-speed, low voltage core logic transistors can be used.

The use of high-speed, low voltage transistors can involve clamping the voltage on each transistor to be within a tolerance range less than 0.9v. One such method involves the coupling of a protection transistor in series with an operational transistor so that the gate of the protection transistor is connected to a protection voltage, for example VDD (VSSG=VDDQ−VDD). Using this approach, VDD should be "ON" before VDDQ is "ON" to protect the high-speed, low voltage transistors. If not, when VDDQ is "ON" and VDD=0, the low-voltage transistor can be stressed by a voltage (1.5v) which is beyond the voltage tolerance range of the low voltage transistor. Such stress can cause long term reliability issues and/or permanent damage.

To meet such voltage requirements during system turn-on operations, power sequencing can be used, for example, where sequencing is allowed by system specifications. However, such sequencing may not be possible sometimes. For example, DDR3 dual in-line memory module (DIMM) specifications do not include such sequencing. Also, for DIMM design, it is possible to have a VDD power outage unintentionally while VDDQ is still "ON". In order to design a universal DDRX IP, specifications should be met without the imposition of additional system requirements (e.g., without requiring power-up sequencing).

Some approaches: (1) specify that VDD should be "ON" before VDDQ is "ON" and/or (2) involve the derivation of the protection voltage from VDDQ. However, in some cases, for example, where the DDRX I/O supply VDDQ varies from 1.14v to 1.575v based on a different DDR specification the VDDQ derived protection voltage can vary as well. Designing circuits that can accommodate such voltage variation in VDDQ can present a challenge. If a circuit is not designed correctly, the derived voltage from VDDQ can impair normal operation of the circuit. For example, if the protection voltage (VDDPROT) relates to VDDQ as follows, VDDPROT=0.6*VDDQ, the protection voltage derived from VDDQ can range from 0.684v to 0.945v. However, a clamping voltage of 0.684v is too low for 1.2v I/O operation in many cases.

The examples described herein provide a circuit protection design which enables the generation of a protection voltage when VDD is "OFF" and VDDQ is "ON" and the switchover to a VDD supply when VDD is "ON". Thus, VDD and VDDQ power sequencing is not necessary. In addition, the switching from VDD to a protection voltage is accomplished without additional control logic. As such, circuit protection is provided in cases of VDD power rail outage while VDDQ is still "ON" (because of the automatic switching). The examples provided are not limited to DDR IP design and can be applied to any multi-power supply rail chip design. The voltages used in the description of circuitry herein are only examples, and other voltages can be used. Likewise, other types of transistors than are described herein as a part of example implementations can be used.

FIG. 1A is a schematic illustration of an example operating environment of a protection voltage providing circuit. FIG. 1A shows input/output (I/O) circuit 100, protection voltage providing circuit 101, CPU 103, data driver 105, receiver amplifier 107, memory 109, and I/O devices 111.

Referring to FIG. 1A, the I/O circuit 100 is used as a communication interface between the I/O devices 111 (e.g., keyboard, mouse, printer, modem, etc.) and the CPU 103. In some examples, the I/O circuit 100 can include logic to interpret device addresses generated by the CPU 103. In some examples, the I/O circuit 100 accommodates a plurality of voltage domains and provides multiple compatible voltage levels. In some examples, the protection voltage providing circuit 101 ensures that excessive voltage from a higher voltage domain is not supplied to core logic of associated with a lower voltage domain (e.g., data driver 105, receiver amplifier 107). For example, the protection voltage providing circuit 101 provides a safe protection voltage to core logic circuits when there is a voltage supply failure so that damage to electronic components is prevented. In some examples, the protection voltage has a magnitude/level that can be safely supplied to the core logic circuits (e.g., the data driver 105, the receiver amplifier 107, etc.).

The data driver 105 is an amplifier circuit designed to drive a load such as a transmission line. The data driver 105 can be used to communicate signals across a bus. In some examples, the protection voltage is used to ensure that the data driver 105 is supplied with a safe voltage if the primary supply voltage fails during normal circuit operation. In some examples, a safe voltage is a voltage that has a magnitude that is within the tolerance range of the transistors of the data driver 105. In some examples, if VDD fails during normal circuit operation, or during the power-up process, the protection voltage ensures that the data driver 105 is supplied with a safe voltage that has a magnitude that is a fraction of VDDQ.

The receiver amplifier 107 is an electronic amplifier circuit designed to receive data that is transmitted over a bus. In some examples, in a manner similar to that described with reference to the data driver 105, a protection voltage is used to ensure that the receiver amplifier 107 is supplied with a safe voltage in case of the failure of its normal supply voltage. In some examples, the safe voltage has a magnitude that within the tolerance range of the transistors of the receiver amplifier 107. In some examples, if VDD fails during normal circuit operation, or during the power up process, the protection voltage that is used to ensure that the data driver is supplied with a safe supply voltage is switched from a voltage that has a magnitude that is equal to VDD to a voltage that has a magnitude that is equal to a fraction of VDDQ.

In operation, referring to FIG. 1A, during normal operation a supply voltage that is equal to VDD is supplied to core logic circuitry of the I/O circuit 100. In some examples, the core logic circuitry can include but is not limited to the data driver 105 and the amplifier 107. As described herein, the protection voltage providing circuit 101 ensures that VDD, rather than a higher voltage from a higher voltage domain such as VDDQ, is supplied to the core logic circuitry. If VDD fails during normal operation or during power-up/power-down operations, protection voltage providing circuit 101 ensures that a safe voltage VDDPROT is supplied to the core logic circuitry.

Figure 1B:
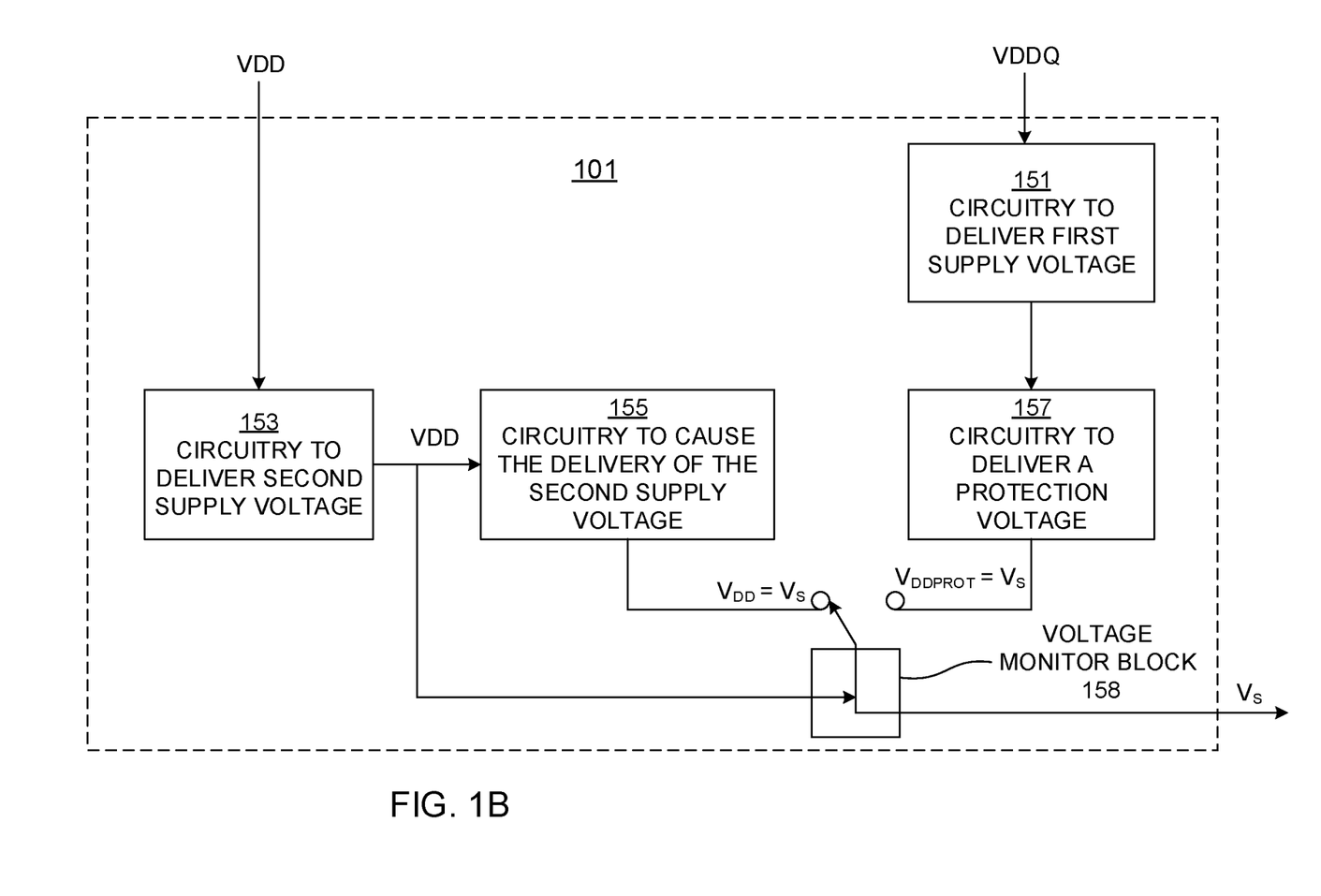
FIG. 1B is a schematic illustration of an example protection voltage providing circuit.

FIG. 1B shows example components of the protection voltage providing circuit 101. Example components of protection voltage providing circuit 101 can include circuitry to deliver first supply voltage 151 (e.g., VDDQ), circuitry to deliver second supply voltage 153 (e.g., VDD), circuitry to cause the delivery of the second supply voltage 155 and circuitry to deliver a protection voltage 157. During normal operation voltage VDDQ is supplied to the I/O circuit 100 (e.g., a plurality of circuits) and VDD is supplied to core logic circuitry (a subset of the plurality of circuits). Referring to FIG. 1B, if the protection voltage providing circuit 101 detects the failure of VDD (the second supply voltage) during normal operation or during power-up/power-down operations, responsive to such detection, the protection voltage providing circuit 101 causes the supply of a safe voltage (protection voltage VDDPROT) to the core logic circuitry (e.g., receiver amplifier and data driver). For example, if a failure of VDD is detected, the supply of voltage, Vs, to the subset of the plurality of circuits 158 is switched from the circuitry to cause the delivery of the second supply voltage 155 to the circuitry to deliver a protection voltage 157. More specifically, the voltage that is supplied to the subset of the plurality of circuits 158 is switched from VDD to the protection voltage VDDPROT that is produced by the circuitry to deliver a protection voltage 157. The generation of the protection voltage VDDPROT is described with reference to FIG. 2.

Figure 2:
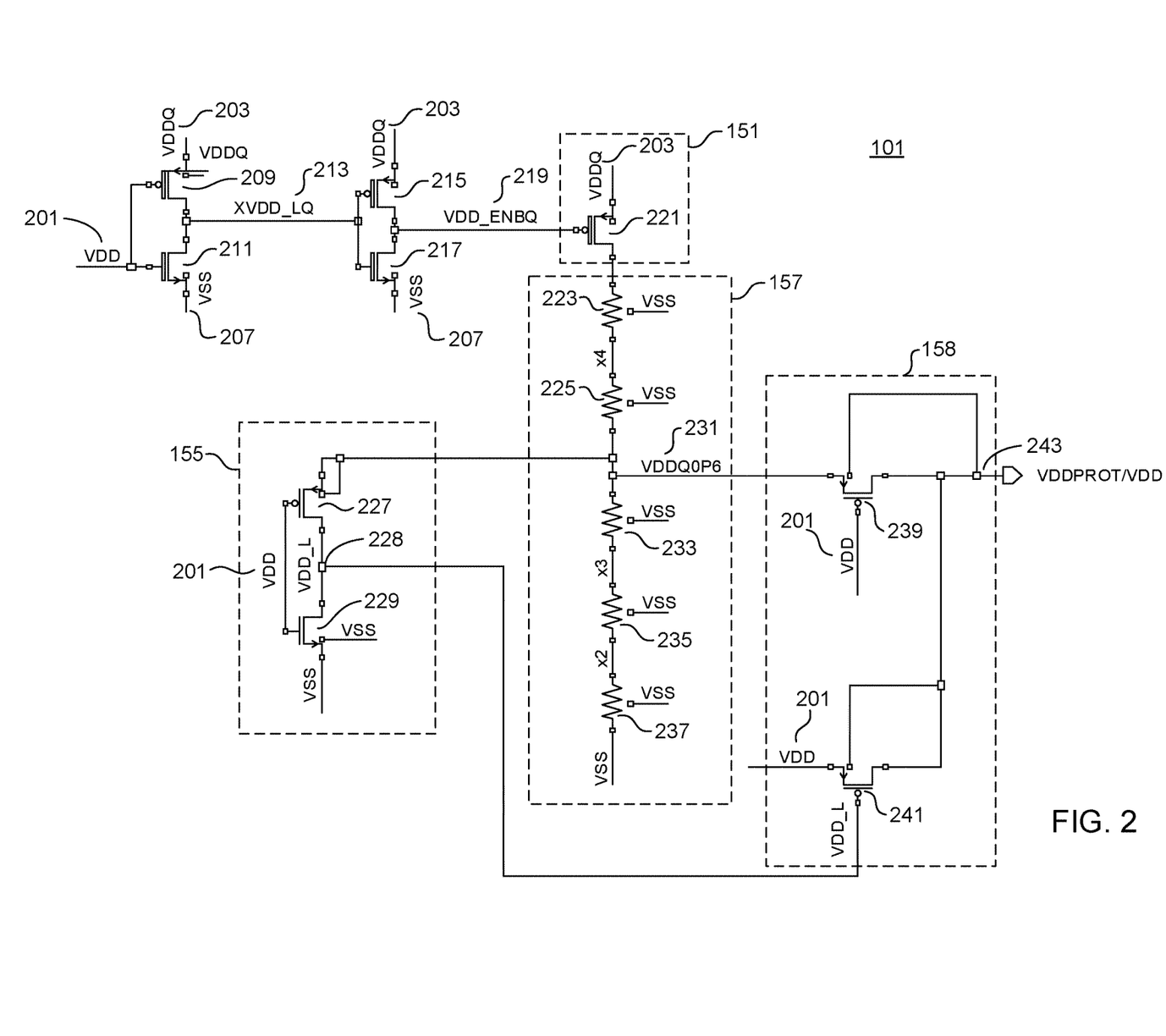
FIG. 2 is a schematic illustration of an example implementation of the protection voltage providing circuit of FIG. 1A.

FIG. 2 is a schematic illustration of an example protection voltage providing circuit 101. In some examples, the protection voltage providing circuit 101 includes circuitry that delivers a protection voltage and circuitry that that controls switching from a second supply voltage to the protection voltage. Referring to FIG. 2, during normal operation VDD is supplied through transistor 241. In the event of a failure of VDD, protection voltage 243 is generated from supply voltage VDDQ 203 through a resistor stack that includes resistors 223, 225, 233, 235 and 237 of the circuitry to deliver a protection voltage 157. In some examples, the voltages VDDPROT 243 that are supplied during normal operation and upon failure are respectively VDD and 0.6*VDDQ. In other examples, other voltage magnitudes can be used. In some examples, protection voltage providing circuit 101 includes a high voltage transistor 221 that provides a gating function and operates to save static power during normal circuit operation. In other examples, other types of gating approaches can be used.

In some examples, the possible voltage states of VDD 201 and VDDQ 203 are VDD 201=logic 0 and VDDQ 203=logic 1, VDD 201=logic 1 and VDDQ 203=logic 1, VDD 201=logic 1 and VDDQ 203=logic 0, and VDD 201=logic 0 and VDDQ 203=logic 0. Each of the possible voltage states of VDD and VDDQ results in a protection voltage supply circuit output. In some cases, a change from one of the voltage states of VDD and VDDQ to another causes a switch from VDD to protection voltage VDDPROT or to a zero output. The operation of the protection voltage supply circuit 101 with respect to each of the voltage states is described below.

Referring to FIG. 2, when VDD 201=logic 0 and VDDQ 203=logic I, because VDD 201=0 and XVDD_LQ 213=1, VDD_ENBQ 219=0, which causes high voltage I/O p-type (sometimes referred to as p-channel) FET (pFET) 221 to turn on, which generates VDDQ0P6=0.6*VDDQ. XVDD_LQ 213 and VDD_ENBQ 219 are nodes on which enable signals are passed. In the illustrated example, XVDD_LQ 213 is the logic inversion from VDD 201 and converted into VDDQ domain. VDD_ENBQ 219 is the same logic polarity as VDD 201 but in the VDDQ domain. In some examples, the voltage of VDD 201 may range from 0v (logic 0) and 0.9v (logic 1), and the voltage of VDDQ 203 may range from 0v (logic 0) to 1.2v to 1.5v (logic 1). Therefore, the VDD 201 signal needs to level shift into the VDDQ electrical domain to be used correctly. In the illustrated example, transistor 211 is an n-type (sometimes referred to as an n-channel) FET (nFET), and transistor 209 is a pFET.

In general, FETS include a body (substrate) and three terminals: a source, a gate, and a drain. In some examples, when a voltage is applied at the gate, a channel is formed in the body (substrate) that enables electrons to flow between the source and the drain. FETS may also be designed conversely to allow the flow of electrons between the source and the drain until a voltage is applied at the gate. In n-type FETS, the gate attracts free-floating electrons within the body toward the gate, thereby forming a conductive channel between the source and the drain. In p-type FETS, the gate voltage creates a depletion layer by forcing charged holes to the gate/body interface, which leaves a carrier-free region or immobile, negatively charged acceptor ions.

In the illustrated example, transistors 211 and 209 form a first inverter. The gates of transistors 211 and 209 are gated at VDD 201, the source of transistor 209 is connected to VDDQ 203, and the source of transistor 211 is connected to VSS 207. The drains of transistors 209 and 211 (the first inverter) are connected (via XVDD_LQ 213) to the gates of transistors 215 and 217. Transistor 217 is an nFET and transistor 215 is a pFET, which form a second inverter. The source of transistor 215 is connected to VDDQ 203 and the source of transistor 217 is connected to VSS 207. Transistor 221 of the circuitry to deliver first supply voltage 151 is gated (via VDD_ENBQ 219) by the drains of transistors 215 and 217. The source of transistor 221 is connected to VDDQ 203 and the drain of transistor 221 connects to the stack of resistors 223, 225, 233, 235, and 237 in the circuitry to deliver protection voltage 157.

In the illustrated example, the two inverters (transistors 211 and 209 and transistors 215 and 217) connect in series to form a buffer that acts as a level shifter. The input trip point of the inverters is based on the pFET/nFET size ratio. For example, if pFET/nFET=1, then the input trip point would be VDDQ/2 (e.g., for a 16 nm finfet process). In some examples, the first inverter (transistors 209 and 211) is designed with a pFET/nFET ratio=1/16, so that the input trip point is less than VDDQ/2. Therefore, when VDD=0.9v, VDDQ=1.5v, and the pFET/nFET ratio=1/16, the output XVDD_LQ=21 mv, which is not exactly 0v. However, when VDD=0.9v, VDDQ=1.2v, and the pFET/nFET ratio=1/16, the output XVDD_LQ−0.5 mv, which is effectively 0v. In some examples, the second inverter is designed with pFET/nFET ratio=1, so that the input trip point=VDDQ/2. Therefore, when VDD=0.9v and VDDQ=1.5v, XVDD_LQ=21 mv and VDD-ENBQ=VDDQ. As such, VDD=0.9v (logic 1) is level shifted into output=VDDQ (logic 1).

In the illustrated example, the circuitry to cause the delivery of the second supply voltage 155 includes transistors 227 and 229 (an nFET/pFET pair). Transistors 227 and 229 are gated by VDD 201. The source of transistor 229 is connected to VSS, and the source of transistor 207 is connected between two of the resistors 225 and 233. The drains (VDD_L) of transistors 227 and 229 are connected to a gate of transistor 241 in the voltage monitor block 158. The source of transistor 241 is connected to VDD 201. The drain of transistor 241 is connected to the drain of transistor 239 (as well as the n-wells of transistors 239 and 241, as disclosed in further detail herein) at VDDPROT/VDD. The source of transistor 239 is connected between two of the resistors 225 and 233 of the circuitry to deliver a protection voltage 157. Transistor 239 is gated by VDD 201.

As disclosed above, when VDD 201=logic 0 and VDDQ 203=logic I (i.e., because VDD 201=0 and XVDD_LQ 213=1), VDD_ENBQ 219=0, which causes pFET 221 to turn on, which generates VDDQ0P6=0.6*VDDQ. At this point, because VDD 201=0, a low voltage pFET 239 is "ON", which causes VDDPROT 243=VDDQ0P6. Because VDD 201=logic 0 and VDDQ0P6 231=logic 1, VDD_L 228=1, which turns off low voltage pFET 241, which isolates protection voltage output VDDPROT 243 from VDD 201. These actions cause the body (n-well) of pFETS 239 and 241 to connect to the protection voltage output VDDPROT 243 (high voltage), which enables pFETS 239 and 241 to operate normally. In particular, p-type and n-type metal-oxide-semiconductor FETS (MOSFETS) are commonly paired in the form of complementary metal-oxide-semiconductor (CMOS) logic. The p-substrate in the n-type MOSFET is usually connected to GND=0v through a sub-strate-body-tie P+, sometimes referred to node B. The p-type MOSFET includes an n-well in the p-substrate. The n-well needs to be connected to the highest voltage of the p-type MOSFET (either the source (S) node or the drain (D) node) through n-well-body-tie n+ node B. If the voltage of node S or node D is greater than the voltage of node B, leakage occurs from P+ to the n-well, which may cause problems. Since VDDPROT is (always) greater than VDD or VDDQ0P6, this ensures that the n-wells are properly biased so that FETS 239 and 241 operate correctly. In other words, because the n-wells of pFETS 239 and 241 are connected to VDDPROT (which is higher than VDD or VDDQ0P6), this arrangement ensures the voltage in the n-wells is greater than the S nodes to reduce or eliminate potential leakage.

Because VDD 201=0, the overall chip (e.g., the I/O circuit) is not in normal operation mode, and VDDPROT 243 provides the protection voltage or voltage reference for core logic circuits. It should be appreciated that in the instant case where VDD 201=logic 0 and VDDQ 203=logic 1, and VDDQ 203 can fluctuate, for example, from 1.I4v to 1.575v, VDDPROT 243 can range from 0.684v to 0.945v. In other examples, where other VDDQ 203 voltage ranges are used, other VDDPROT 243 ranges can be produced.

When VDD 201=logic 1 and VDDQ 203=logic 1, the I/O circuit is in normal operating mode. Because VDD 201=1 and XVDD_LQ 213=0, VDD_ENBQ 219=1 and high voltage I/O pFET 221 is turned off, which causes VDDQ0P6 231=0. Because VDD 201=1, low voltage pFET 239 is "OFF", which isolates VDDPROT 243 from VDDQ0P6 231. Because VDD 201=1 and VDDQ0P6 231=0, VDD_L 228=0, which turns on low voltage pFET 241, which causes the production of VDDPROT 203=VDD 201. The body (NWell) of pFETS 239 and 241 connect to VDDPROT 243 (high voltage supply) which causes the proper operation of these transistors. The intended protection voltage for normal operation is VDDPROT 243=VDD 201.

When VDD 201=logic 1 and VDDQ 203=logic 0, because VDDQ 203=logic 0, XVDD_LQ 213=0 and VDD_ENBQ 219=0, which turns on high voltage IO pFET 221. Because VDDQ 203=0, VDDQ0P6 231=0. Because VDD 201=1, low voltage pFET 239 is 'OFF', which isolates VDDPROT 243 from VDDQ0P6 231. Because VDD 201=1 and VDDQ0P6 231=0, VDD_L 228=0, which turns on low voltage pFET 241, and causes VDDPROT 243=VDD 201. The body (NWell) of 239 and 241 connect to VDDPROT 243 which causes the proper operation of these transistors.

When VDD 201=logic 0 and VDDQ 203=logic 0, there is no power supplied to the chip, and circuit nodes are at "0". In this status there isn't a voltage protection issue.

Figure 3:
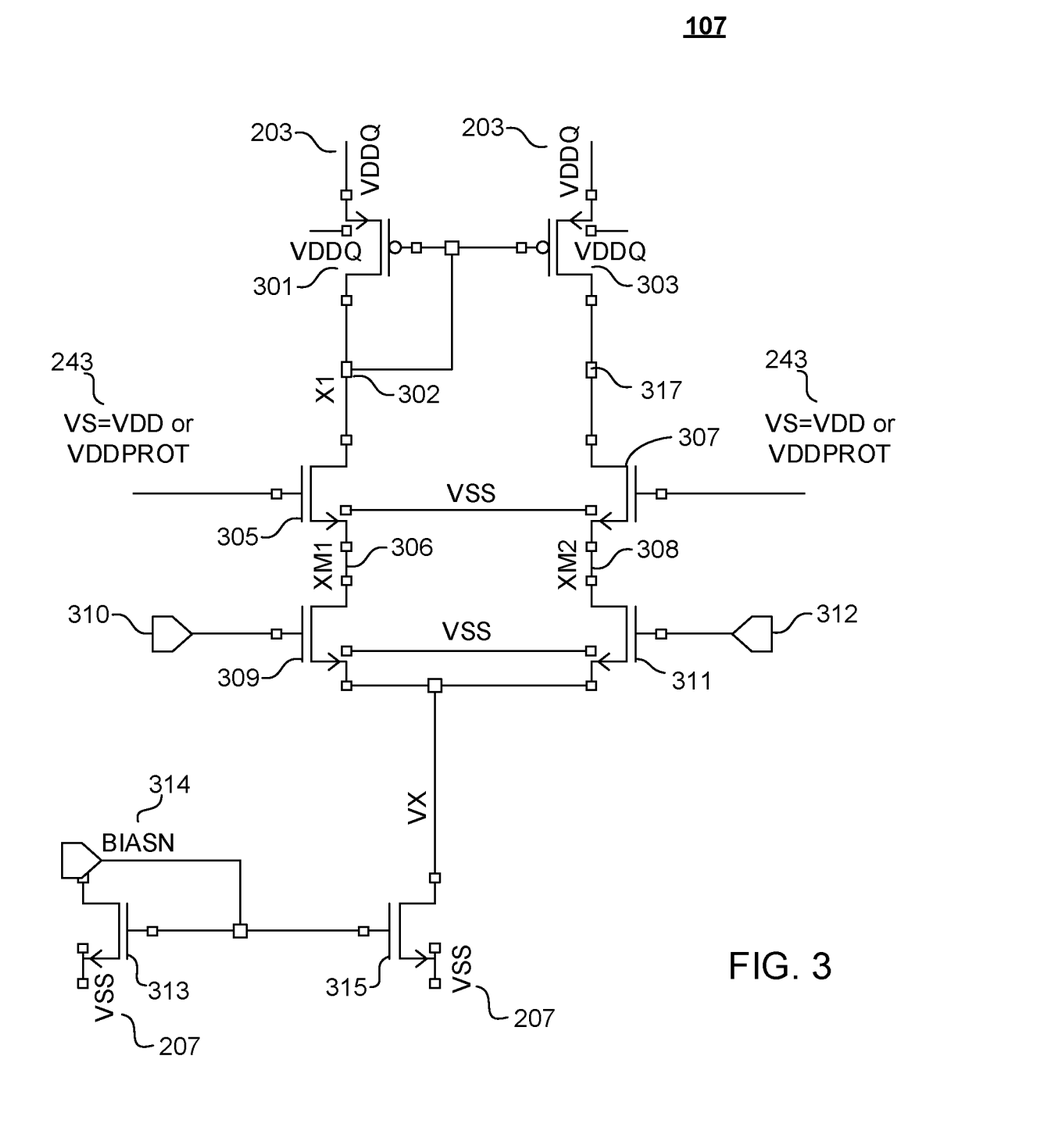
FIG. 3 is a schematic of an example implementation of the receiver amplifier of FIG. 1A.

FIG. 3 is a schematic of the example receiver amplifier 107 of an I/O circuit. The receiver amplifier 107 is an electronic amplifier circuit designed to receive data transmitted over a transmission line. In some examples, a protection voltage can be used to ensure that the receiver amplifier 107 is supplied with a safe supply voltage.

In the example of FIG. 3, the transistors 301, 303, 305, 307, 309, 311, 313, and 315 of the amplifier 107 are low-voltage core FETS. In the illustrated example, transistors 301 and 303 are pFETS, and transistors 305, 307, 309, 311, 313, and 315 are nFETS. In some examples, the transistors of the amplifier 107 have a voltage tolerance range of |Vgs|<1v, |Vds|<1v, |Vgd|<1v. In the illustrated example, IN_P 310 and IN_N 312 are positive and negative input terminals, respectively, of the receiver amplifier 107. In some examples, IN_P 310 and IN_P 312 range from 0v to 0.9v. BIASN 314 is a bias voltage that creates a tail current for the receiver amplifier 107. In some examples, the input signal is a current (e.g., about 50 pA). The nFETS 313 and 315 form a current mirror to create proper current for the receiver amplifier 107. In particular, nFETS 313 and 315 form a current mirror to convert input current through BIASN 314 to tail current on nFET 315 drain VX. The gate of nFETS 313 and 315 connect to BIASN 314. The sources of nFETS 313 and 315 are connected to VSS 207.

In the illustrated example, nFETS 309 and 311 form an input differential pair that provides current gain. The sources of nFETS 309 and 311 connect to tail current VX (from the drain of nFET 315). Their body-tie connects to VSS(GND). The drain of nFET 309 connects to XM1 306, and the drain of nFET 311 connects to XM2 308. nFET 309 is gated by IN_P 310 (positive terminal) and nFET 311 is gated by IN_N 312 (negative terminal).

In the illustrated example, the sources of nFETS 305 and 307 are connected to XM1 306 and XM2 308, respectively. Their body-tie connects to VSS (GND). The gates of nFETS 305 and 307 (voltage clamping FETS) connect to VDD or VDDPROT 243, to ensure that the max voltage of nFET 305 source (XM1 306) and nFET source 307 (XM2 308) do not exceed VDD or VDDPROT, such that nFETS 309, 311, and 315 would not be exposed to higher than 0.9v voltage tolerance limit for low-voltage FETS. Since nFETS 305 and 307 are always "ON," the max voltage difference among gate, source, and drain does not exceed 0.9v in all cases.

In the illustrated example, pFETS 301 and 303 provide differential load for the amplifier 107. In particular, pFETS 301 and 303 convert differential current gain to voltage gain at an output 317. The output 317 can be as high as VDDQ. The sources of pFETS 301 and 303 are connected to VDDQ 203. pFET 301 is diode-connected with the drain and the gate connected together at X1 302, and the gate of pFET 303 is also connected to X1 302. The drain of pFET 303 connects to the drain of nFET 307, as an output, and the drain of nFET 307. The drain of pFET 301 is connected to the drain of nFET 305.

In some examples, during normal operation, VDD 201=0.9v, VDDQ 203=1.5v and BIASN 314=0.4v. In operation, when IN_P 310=0.9v and IN_N 312=0v, XM1 306 is pulled low and XM2 308=VDD 201. Under such conditions, the transistors of the receiver amplifier 107 are within a safe voltage region. When IN_P 310=0.9v and IN_N 312=0.9v, XM1 306=XM2 308. In such example, XM1 306=XM2 308 is designed to fall within a safe core FET voltage region. When IN_P 310=0v and IN_N 312=0v, XM1 306=XM2 308=VDD 201, and transistor voltages of the receiver amplifier 107 fall within safe core FETS voltage regions. In the event of power failure where VDD 201=0 and VDDQ 203=1.5v and node X1 302=VDDQ 203=1.5v, Vgd (transistor 305)=−1.5v, which falls outside of the core FETS voltage tolerance region. In this case, the voltage protection circuit 101 will cause VDDPROT 243 to be supplied to the gate of transistor 305. Thus, the receiver amplifier 107 uses low-voltage core transistors in a high voltage domain (e.g., VDDQ=1.2v to 1.5v).

Figure 4:
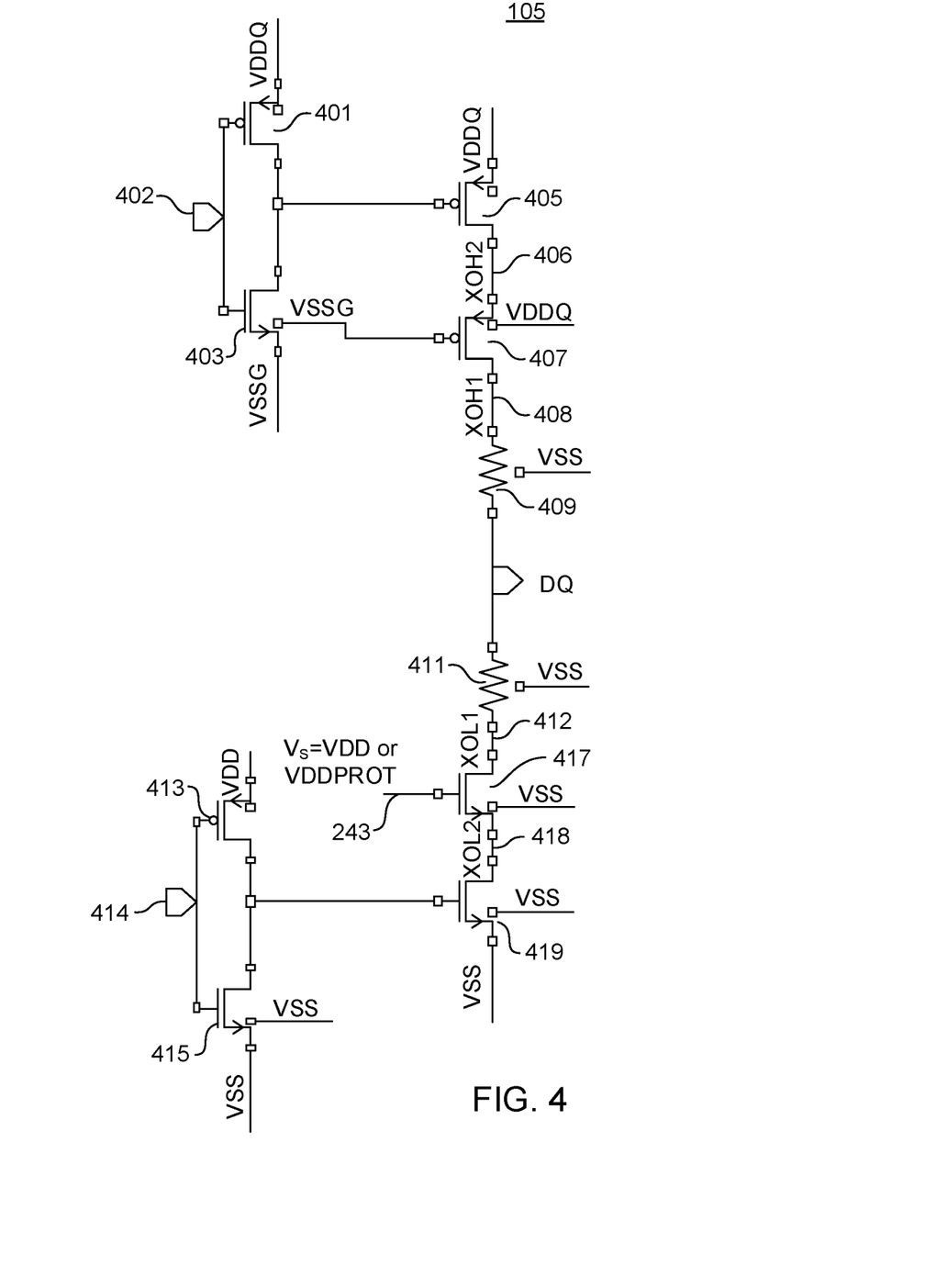
FIG. 4 is a schematic of an example implementation of the data driver of FIG. 1A

FIG. 4 is a schematic of an example data driver of an I/O circuit. The data driver 105 is an electronic circuit designed to drive a load such as a transmission line. The data driver 105 is used to communicate signals (digital) across the transmission lines. In some examples, a protection voltage can be used to ensure that the data driver is supplied with a safe supply voltage. In some examples, a safe supply voltage has a magnitude that is within the tolerance range of the transistors of the data driver 105.

In the FIG. 4 example, the transistors 401, 403, 405, 407, 413, 415, 417, and 419 of the data driver 105 are low-voltage core FETS. Transistors 401, 405, 407, and 413 are pFETS, and transistors 403, 415, 417, and 419 are nFETS. In the illustrated example, pFET 401 and nFET 403 are gated by D_INH 402 (a data driver voltage). The source of pFET 401 is connected to VDDQ and the source of nFET 403 is connected to VSSG. The drains of pFET 401 and nFET 403 are connected to the gate of pFET 405, and the body of nFET 403 which is connected to VSSG is also connected to the gate of pFET 407. The source of pFET 405 is connected to VDDQ and the drain (XOH2 406) of pFET 405 is connected to the source of pFET 407. The body of pFET 407 is connected to VDDQ. The drain (XOH1 408, a data driver voltage) of pFET 407 is connected via resistor 409 to DQ.

In the illustrated example, pFET 413 and nFET 415 are gated by D_INL 414. The source of pFET 413 is connected to VDD and the source of nFET 415 is connected to VSS. The body of nFET 415 is also connected to VSS. The drains of pFET 413 and nFET 415 are connected to the gate of nFET 419. The source of nFET 419 is connected to VSS and the drain of nFET 419 is connected (via XOL2 418, a data driver voltage) to the source of nFET 417. The body of nFET 419 is connected to VSS. nFET 417 is gated by VS, which is either VDD or VDDPROT 243. The body of nFET 417 is connected to VSS. The drain of nFET 417 is connected to DQ via resistor 411 (at XOL1 412, a data driver voltage).

In some examples, the voltages of the transistors 401, 403, 405, 407, 413, 415, 417, and 419 of the data driver 105 have a tolerance range of |Vgs|<1v, |Vds|<1v, and |Vgd|<1v. VSSG=VDDQ 203−VDD 201=0.6v, and thus are derived from VDDQ 203 with VDD 201 as a reference voltage. During normal operation VDD 201=0.9v and VDDQ 203=1.5v. When D_INL 414=logic 1 and D_INH 402=logic 1, transistor 405 is ON and transistor 419 is OFF; DQ=VDDQ 203=1.5v and node XOL2 418=VDD 201=0.9v such that the voltages that are supplied to the transistors of data driver 105 fall within a safe voltage tolerance range. When D_INL 414=logic 0 and D_INH 402=logic 0, transistor 405 is OFF and transistor 419 is ON=>DQ=0 and node XOH2 406=VSSG=0.6v such that the voltages that are supplied to the transistors of data driver 105 fall within a safe voltage tolerance range. When D_INL 414=logic 0 and D_INH 402=logic 1, transistor 405 is ON and transistor 419 is ON, moreover, 1.5v>DQ>0v, 1.5v>XOH2 406>0.6v and 0.9v>XOL2 418>0v such that the voltages that are supplied to the transistors of the data driver 105 are within a safe voltage tolerance range. When D_INL 414=logic 1 and D_INH 402=logic 0, transistor 405 is OFF and transistor 419 is OFF, moreover, 1.5v>DQ>0v, 1.5v>XOH2 406>0.6v and 0.9v>XOL2 418>0v, such that the voltages that are supplied to transistors of data driver 105 are within the safe voltage tolerance range. In the event of VDD 201 power failure, where VDD 201=0 and VDDQ 203=1.5v, Vg (transistor 417)=0 and transistor 417 and transistor 419 are OFF. VSSG=1.5v, node DQ can be either 0v or 1.5v depending on conditions, and |Vgd| for transistor 417 or transistor 407 may be >1v, which is outside of the voltage tolerance range. Responsive to a power failure of VDD 201, the protection voltage circuit provides VDDPROT 243 as a replacement for VDD 201 at the gate of transistor 417. In this example, VSSG=VDDQ 203−VDDPROT 243.

While an example manner of implementing the protection voltage circuit 101 of FIG. 1A is illustrated in FIG. 2, one or more of the elements, processes and/or devices illustrated in FIG. 2 may be combined, divided, re-arranged, omitted, eliminated and/or implemented in any other way. Further, the example the example protection voltage circuit 101 of FIG. 1A may be implemented by hardware, software, firmware and/or any combination of hardware, software and/or firmware. Thus, for example, any of the example, the example protection voltage circuit 101 could be implemented by one or more analog or digital circuit(s), logic circuits, programmable processor(s), application specific integrated circuit(s) (ASIC(s)), programmable logic device (s) (PLD(s)) and/or field programmable logic device(s) (FPLD(s)). When reading any of the apparatus or system claims of this patent to cover a purely software and/or firmware implementation, the protection voltage circuit 101 is/are hereby expressly defined to include a tangible computer readable storage device or storage disk such as a memory, a digital versatile disk (DVD), a compact disk (CD), a Blu-ray disk, etc. storing the software and/or firmware. Further still, the example protection voltage circuit 101 of FIG. 1A may include one or more elements, processes and/or devices in addition to, or instead of, those illustrated in FIG. 2, and/or may include more than one of any or all of the illustrated elements, processes and devices.

Figure 5:
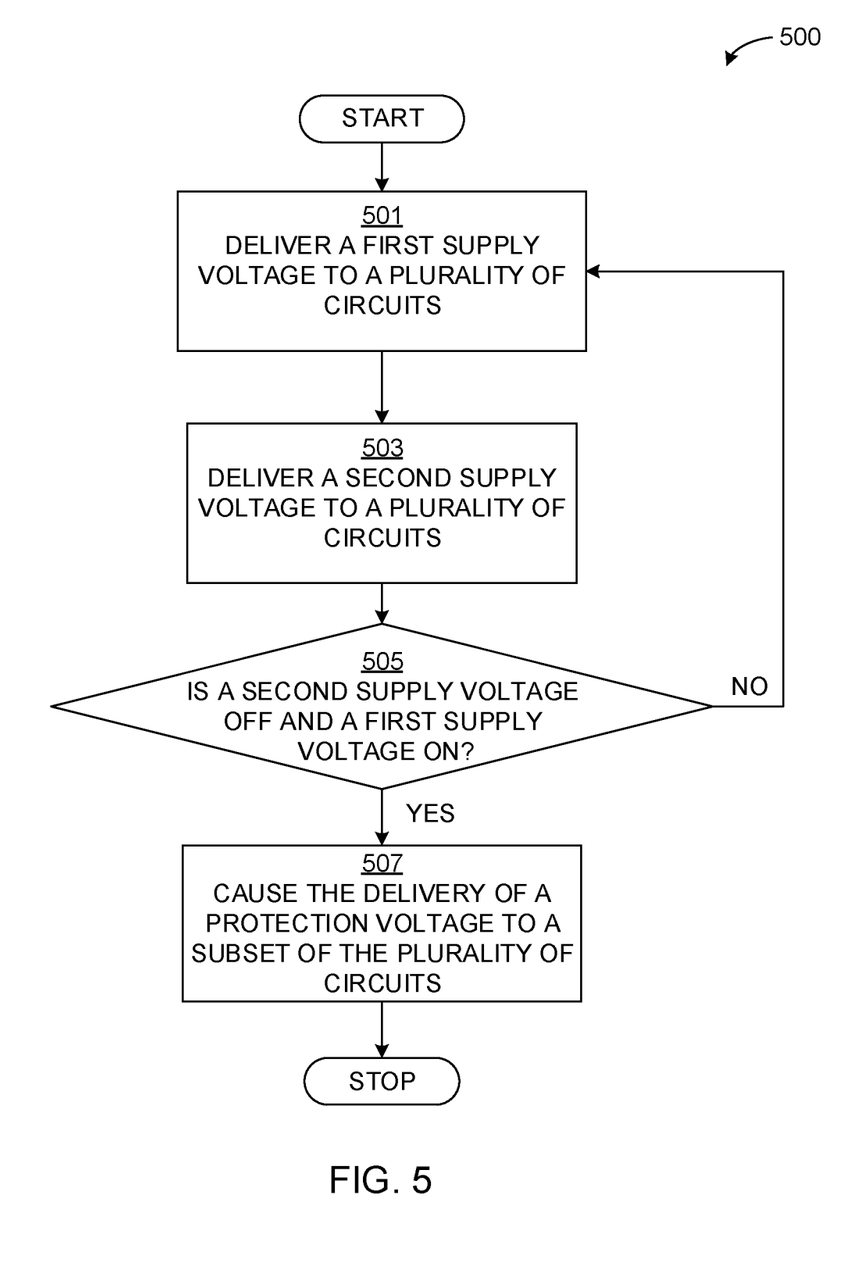
FIG. 5 is a flowchart of a method to produce a circuit protection voltage.

FIG. 5 is a flowchart representative of an example method that may be implemented to produce a circuit protection voltage. Referring to FIG. 5, circuitry to deliver a first supply voltage 151, delivers a first supply voltage VDDQ to a plurality of circuits (block 501). The first supply voltage has a first magnitude. Circuitry to deliver a second supply voltage 153 delivers a second supply voltage VDD to a portion of the plurality of circuits (block 503). The second supply voltage has a second magnitude.

Voltage monitor block 158 determines if the second supply voltage is off and the first supply voltage is on (block 505).

Circuitry to deliver a protection voltage 157 delivers a protection voltage VDDPROT to the subset of the plurality of circuits when the second supply voltage is OFF and the first supply voltage is ON (block 507). The protection voltage has a magnitude that is a fraction of the magnitude of the first supply voltage. If the second supply voltage is ON and the first supply voltage is ON, the second supply voltage is continued to be supplied to the subset of the plurality of circuits (block 503).

The second supply voltage VDD 201 is caused to be delivered to the subset of the plurality of circuits when the second supply voltage is turned ON subsequent to the second supply voltage being OFF when the first supply voltage is ON.

Figure 6:
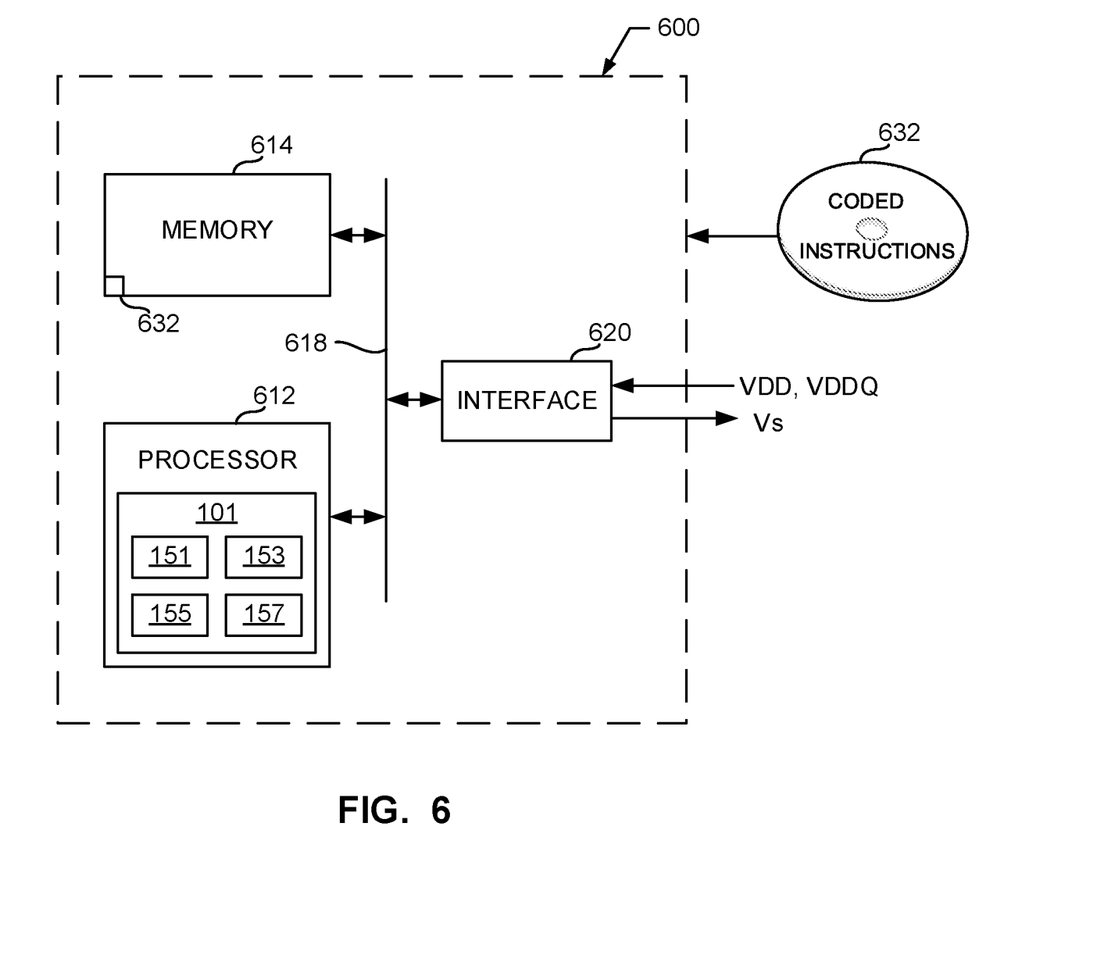
FIG. 6 is a block diagram of an example processor platform that may be used to implement some of the aspects of a protection voltage providing circuit.

FIG. 6 is a block diagram of an example processor platform 600 capable of being used to implement the protection voltage circuit 101 of FIG. 1A. In particular, the method of FIG. 5 may be implemented by example machine readable instructions for execution by a processor such as the processor 612 shown in the example processor platform 600. The program may be embodied in software stored on a tangible computer readable storage medium such as a CD-ROM, a floppy disk, a hard drive, a digital versatile disk (DVD), a Blu-ray disk, or a memory associated with the processor 612, but the entire program and/or parts thereof could alternatively be executed by a device other than the processor 612 and/or embodied in firmware or dedicated hardware. As used herein, the term tangible computer readable storage medium is expressly defined to include any type of computer readable storage device and/or storage disk and to exclude propagating signals and to exclude transmission media. The processor platform 600 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 600 of the illustrated example includes the processor 612. The processor 612 of the illustrated example is hardware. For example, the processor 612 can be implemented by one or more integrated circuits, logic circuits, microprocessors or controllers from any desired family or manufacturer. In this example, the processor 612 may implement the example circuitry to deliver first supply voltage 151, the example circuitry to deliver second supply voltage 153, the example circuitry to cause the delivery of the second supply voltage 155, the example circuitry to deliver a protection voltage 157, and/or, more generally, the example protection voltage providing circuit 101.

The processor 612 of the illustrated example is in communication with a memory 614 (which may include a volatile memory or a non-volatile memory) via a bus 618. The memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. In other examples, the memory 614 may be implemented by flash memory and/or any other desired type of memory device. Access to the memory 614 may be controlled by a memory controller.

The processor platform 600 of the illustrated example also includes an interface circuit 620. The interface circuit 620 may be implemented by any type of interface standard, such as an Ethernet interface, a universal serial bus (USB), and/or a PCI express interface. In the illustrated example, the interface circuit 620 receives VDD and VDDQ and outputs VS (in accordance with the instructions of FIG. 5 executed by the processor 612).

The coded instructions 632 of FIG. 5 may be stored in the memory 614, in the processor 612, and/or on a removable tangible computer readable storage medium such as a CD or DVD. Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this tent.

What is claimed is:

1. An apparatus to produce a protection voltage, the apparatus comprising:
   circuitry to output a first supply voltage, the first supply voltage having a first magnitude, and wherein the first supply voltage is provided to a plurality of circuits;
   circuitry to output a second supply voltage, the second supply voltage having a second magnitude;
   circuitry to output a protection voltage, the protection voltage having a magnitude that is a fraction of the magnitude of the first supply voltage, and wherein the circuitry to output the protection voltage is enabled when the second supply voltage is low and the first supply voltage is high and disabled when the second supply voltage is high and the first supply voltage is high; and
   circuitry to distribute the protection voltage to a subset of the plurality of circuits in response to the second supply voltage being LOW and the first supply voltage being HIGH and to distribute the second supply voltage to the subset of the plurality of circuits in response to the second supply voltage being HIGH and the first supply voltage being HIGH.

2. The apparatus of claim 1, wherein the circuitry to output the protection voltage includes a voltage divider, and wherein the circuit to output a first supply voltage comprises a gating transistor, thereby preventing a voltage having the first magnitude from being applied to the subset of the plurality of circuits during a power-up/power-down operation.

3. The apparatus of claim 1, wherein the protection voltage is distributed to the subset of the plurality of circuits through a transistor that is gated by the second supply voltage.

4. The apparatus of claim 1, wherein the first supply voltage is within a range between 0 and 1.5 V.

5. The apparatus of claim 1, wherein the second supply voltage is within a range between 0 and 0.9 V.

6. The apparatus of claim 1, wherein the protection voltage is produced from the first supply voltage through a plurality of resistors.

7. The apparatus of claim 1, wherein the first supply voltage has a greater magnitude than the second supply voltage.

8. The apparatus of claim 1, wherein the circuitry to output the first supply voltage includes a transistor that is gated by a first inverter and a second inverter coupled in series, the first inverter to provide logic inversion from the second supply voltage and converted into a first supply voltage domain, and the second inverter having a same polarity as the second supply voltage in the first supply voltage domain.

9. The apparatus of claim 1, wherein the subset of the plurality of circuits including a receiver amplifier, the receiver amplifier including:
   a first pair of transistors including a first transistor and a second transistor, the first and second transistors gated by the protection voltage when the second supply voltage is LOW and the first supply voltage is HIGH;
   a second pair of transistors including a third transistor and a fourth transistor to convert differential current gain to voltage gate at an output, a drain of the third transistor connected to a drain of the first transistor, a drain of the fourth transistor connected to a drain of the second transistor; and
   a third pair of transistors including a fifth transistor and a sixth transistor to provide voltage to current gain, the fifth and sixth transistors gated by positive and negative input terminals, respectively, a drain of the fifth transistor is connected to a source of the first transistor, and a drain of the sixth transistor is connected to a source of the second transistor.

10. The apparatus of claim 9, wherein the receiver amplifier further including:
   a fourth pair of transistors including a seventh transistor and an eighth transistor to form a current mirror to convert input current through a bias voltage to a drain of the seventh transistor, the drain of the seventh transistor connected to sources of the fifth and sixth transistors.

11. An input/output (I/O) circuit, the I/O circuit comprising:
   a protective voltage producing circuitry, the protective voltage producing circuitry comprising:
      circuitry to output a first supply voltage, the first supply voltage having a first voltage level, and wherein the first supply voltage is provided to a plurality of circuits;
      circuitry to output a second supply voltage, the second supply voltage having a second voltage level;
      circuitry to output a protection voltage, the protection voltage having a voltage level that is a fraction of the voltage level of the first supply voltage, and wherein the circuitry to output the protection voltage is enabled when the second supply voltage is low and the first supply voltage is high and disabled when the second supply voltage is high and the first supply voltage is high; and
      circuitry to distribute the protection voltage to a subset of the plurality of circuits in response to the second supply voltage being LOW and the first supply voltage being HIGH and to distribute the second supply voltage to the subset of the plurality of circuits in response to the second supply voltage being HIGH and the first supply voltage being HIGH.

12. The I/O circuit of claim 11, wherein the circuitry to distribute a protection voltage includes a voltage divider, and wherein the circuitry to output a first supply voltage comprises a gating transistor, thereby preventing a voltage having the first magnitude from being applied to the part of the plurality of circuits during a power-up/power-down operation.

13. The I/O circuit of claim 11, wherein the protection voltage is distributed to the subset of the plurality of circuits through a transistor that is gated by the second supply voltage.

14. The I/O circuit of claim 11, wherein the first supply voltage is within a range between 0 and 1.5 V.

15. The I/O circuit of claim 11, wherein the second supply voltage is within a range between 0 and 0.9 V.

16. The I/O circuit of claim 11, wherein the part of the plurality of circuits includes a data driver, the data driver including a first pair of transistors including a first transistor and a second transistor, the first transistor gated by the protection voltage when the second supply voltage is LOW and the first supply voltage is HIGH.

17. The I/O circuit of claim 16, wherein the data driver further includes a second pair of transistors, the second transistor being gated by the second pair of transistors.

18. A method to produce a protection voltage, the method comprising:
   generating a first supply voltage, the first supply voltage having a first magnitude, and wherein the first supply voltage is provided to a plurality of circuits;
   generating a second supply voltage, the second supply voltage having a second magnitude;
   enabling generating of a protection voltage in response to the second supply voltage being LOW and the first supply voltage being HIGH, the protection voltage having a magnitude that is a fraction of the magnitude of the first supply voltage;
   distributing the protection voltage to a subset of the plurality of circuits in response to the second supply voltage being LOW and the first supply voltage being HIGH; and
   disabling the generation of the protection voltage and distributing the second supply voltage to the subset of the plurality of circuits in response to the second supply voltage being HIGH and the first supply voltage being HIGH.

19. The method of claim 18, wherein the first supply voltage is prevented from being used as the protection voltage during power-up/power down by a voltage divider and a gating transistor.

20. The method of claim 18, wherein the protection voltage is distributed to the subset of the plurality of circuits through a transistor that is gated by the second supply voltage.

* * * * *